US011200950B2

(12) United States Patent
Redaelli et al.

(10) Patent No.: US 11,200,950 B2
(45) Date of Patent: Dec. 14, 2021

(54) PROGRAMMING ENHANCEMENT IN SELF-SELECTING MEMORY

(71) Applicant: Micron Technology, Inc., Boise, ID (US)

(72) Inventors: Andrea Redaelli, Casatenovo (IT); Agostino Pirovano, Milan (IT); Innocenzo Tortorelli, Cernusco Sul Naviglio (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/518,847

(22) Filed: Jul. 22, 2019

(65) Prior Publication Data

US 2020/0013463 A1 Jan. 9, 2020

Related U.S. Application Data

(62) Division of application No. 15/582,329, filed on Apr. 28, 2017, now Pat. No. 10,424,374.

(51) Int. Cl.
*G11C 13/00* (2006.01)
*H01L 45/00* (2006.01)
*H01L 27/24* (2006.01)

(52) U.S. Cl.
CPC ...... *G11C 13/0069* (2013.01); *G11C 13/0004* (2013.01); *G11C 13/004* (2013.01);
(Continued)

(58) Field of Classification Search
CPC .............. G11C 13/0069; G11C 13/004; H01L 27/2463
(Continued)

(56) References Cited

U.S. PATENT DOCUMENTS 7,049,652 B2   5/2006 Mokhlesi et al.
7,550,313 B2   6/2009 Arnold et al.
(Continued)

FOREIGN PATENT DOCUMENTS

JP   2008198979 A   8/2008
JP   2009130138 A   6/2009
(Continued)

OTHER PUBLICATIONS

IPO, "Office Action," issued in connection with ROC (Taiwan) Patent Application No. 107114369, dated Apr. 19, 2019 (9 pages).
(Continued)

*Primary Examiner* — Anthan Tran
(74) *Attorney, Agent, or Firm* — Holland & Hart LLP

(57) ABSTRACT

Methods, systems, and devices for programming enhancement in memory cells are described. An asymmetrically shaped memory cell may enhance ion crowding at or near a particular electrode, which may be leveraged for accurately reading a stored value of the memory cell. Programming the memory cell may cause elements within the cell to separate, resulting in ion migration towards a particular electrode. The migration may depend on the polarity of the cell and may create a high resistivity region and low resistivity region within the cell. The memory cell may be sensed by applying a voltage across the cell. The resulting current may then encounter the high resistivity region and low resistivity region, and the orientation of the regions may be representative of a first or a second logic state of the cell.

20 Claims, 9 Drawing Sheets

(52) U.S. Cl.
CPC ...... *G11C 13/0007* (2013.01); *H01L 27/2463* (2013.01); *H01L 45/08* (2013.01); *H01L 45/143* (2013.01); *H01L 45/144* (2013.01); *H01L 45/148* (2013.01); *H01L 45/1675* (2013.01); *G11C 2013/0073* (2013.01); *G11C 2213/52* (2013.01)

(58) Field of Classification Search
USPC .......................................................... 365/63
See application file for complete search history.

(56) References Cited

U.S. PATENT DOCUMENTS

| | | | |
|---|---|---|---|
| 8,153,488 | B2 | 4/2012 | Nishitani et al. |
| 8,179,713 | B2* | 5/2012 | Kanzawa ........... G11C 13/0069 365/148 |
| 8,222,677 | B2 | 7/2012 | Baba et al. |
| 8,502,343 | B1 | 8/2013 | Jha et al. |
| 8,625,325 | B2 | 1/2014 | An et al. |
| 8,847,186 | B2 | 9/2014 | Redaelli et al. |
| 9,257,431 | B2 | 2/2016 | Ravasio et al. |
| 9,337,422 | B2 | 5/2016 | Cheong et al. |
| 9,640,588 | B2 | 5/2017 | Sciarrillo et al. |
| 9,799,381 | B1 | 10/2017 | Tortorelli et al. |
| 10,424,374 | B2 | 9/2019 | Redaelli et al. |
| 10,424,730 | B2 | 9/2019 | Pirovano et al. |
| 2005/0254291 | A1 | 11/2005 | Happ et al. |
| 2006/0157683 | A1 | 7/2006 | Scheuerlein |
| 2007/0010082 | A1 | 1/2007 | Pinnow et al. |
| 2007/0063180 | A1 | 3/2007 | Asano et al. |
| 2007/0097739 | A1 | 5/2007 | Happ et al. |
| 2007/0125953 | A1* | 6/2007 | Miyake ................. G01T 1/246 250/370.01 |
| 2007/0238225 | A1 | 10/2007 | Wicker |
| 2007/0246782 | A1 | 10/2007 | Philipp et al. |
| 2008/0019170 | A1 | 1/2008 | Happ et al. |
| 2008/0044632 | A1 | 2/2008 | Liu et al. |
| 2008/0246014 | A1 | 10/2008 | Lung |
| 2009/0020739 | A1 | 1/2009 | Arnold et al. |
| 2009/0134431 | A1* | 5/2009 | Tabata ................ H01L 27/2481 257/210 |
| 2010/0032725 | A1 | 2/2010 | Baba et al. |
| 2010/0044664 | A1 | 2/2010 | Liu |
| 2010/0243980 | A1 | 9/2010 | Fukumizu |
| 2010/0328996 | A1 | 12/2010 | Shih et al. |
| 2011/0032753 | A1 | 2/2011 | An et al. |
| 2011/0155984 | A1 | 6/2011 | Redaelli et al. |
| 2012/0069645 | A1 | 3/2012 | Goux et al. |
| 2012/0193595 | A1 | 8/2012 | Cheng et al. |
| 2012/0282752 | A1 | 11/2012 | Lee et al. |
| 2014/0034892 | A1 | 2/2014 | Erbetta et al. |
| 2014/0256110 | A1 | 9/2014 | Lung et al. |
| 2014/0319442 | A1 | 10/2014 | Hayashi |
| 2015/0028280 | A1* | 1/2015 | Sciarrillo ............. H01L 27/226 257/4 |
| 2015/0090952 | A1 | 4/2015 | Huang |
| 2015/0200368 | A1 | 7/2015 | Lee et al. |
| 2015/0255507 | A1 | 9/2015 | Pakala et al. |
| 2015/0364681 | A1 | 12/2015 | Murase et al. |
| 2015/0372227 | A1 | 12/2015 | Liu |
| 2016/0020389 | A1 | 1/2016 | Ratnam et al. |
| 2017/0040533 | A1 | 2/2017 | Marsh et al. |
| 2017/0069378 | A1 | 3/2017 | Shifren et al. |
| 2017/0117467 | A1 | 4/2017 | Chang et al. |
| 2017/0125097 | A1 | 5/2017 | Tortorelli et al. |
| 2017/0207387 | A1 | 7/2017 | Yang et al. |
| 2017/0271581 | A1 | 9/2017 | Seong et al. |
| 2017/0346003 | A1 | 11/2017 | Liu |
| 2019/0058109 | A1 | 2/2019 | Chen et al. |
| 2019/0096461 | A1 | 3/2019 | Koike et al. |
| 2019/0252605 | A1 | 8/2019 | Redaelli et al. |

FOREIGN PATENT DOCUMENTS

| | | |
|---|---|---|
| JP | 2009218259 A | 9/2009 |
| JP | 2010186872 A | 8/2010 |
| JP | 2011139057 A | 7/2011 |
| JP | 2012160710 A | 8/2012 |
| JP | 2013016530 A | 1/2013 |
| JP | 2013130138 A | 7/2013 |
| JP | 2014528656 A | 10/2014 |
| JP | 2016015477 A | 1/2016 |
| JP | 2017510983 A | 4/2017 |
| KR | 20090077232 A | 7/2009 |
| KR | 20150085155 A | 7/2015 |
| TW | 200414521 A | 8/2004 |
| TW | 200805632 A | 1/2008 |
| TW | 201222827 A | 6/2012 |
| TW | 201440178 A | 10/2014 |
| TW | 201503287 A | 1/2015 |
| WO | 2015013478 A | 1/2015 |
| WO | 2018200312 A1 | 11/2018 |

OTHER PUBLICATIONS

ISA/KR, International Search Report and Written Opinion of the International Searching Authority, Int'l. Appl. No. PCT/US2019/015671, dated May 14, 2019, Korean Intellectual Property Office, Seo-gu, Daejeon, Republic of Korea, 15 pgs.
ISA/KR, International Search Report and Written Opinion of the International Searching Authority, Int'l. Appl. No. PCT/US2019/015678, dated May 15, 2019, Korean Intellectual Property Office, Seo-gu, Daejeon, Republic of Korea, 15 pgs.
ISA/KR, International Search Report and Written Opinion of the International Searching Authority, Int'l. Appl. No. PCT/US2019/015683, dated May 15, 2019, Korean Intellectual Property Office, Seo-gu, Daejeon, Republic of Korea, 13 pgs.
ISA/KR, International Search Report of the International Searching Authority, Int'l. Appl. No. PCT/US2018/028391, dated Aug. 9, 2018, Korean Intellectual Property Office, Seo-gu, Daejeon, Republic of Korea, 14pgs.
U.S. Appl. No. 15/582,329, filed Apr. 28, 2017.
U.S. Appl. No. 15/621,939, filed Nov. 4, 2015.
Intellectual Property Office of Singapore, "Written Opinion," issued in connection with Patent Application No. 11201909850P, dated Sep. 25, 2020 (10 pages).
Korean Intellectual Property Office, "Notice of Reasons for Rejection," issued in connection with Korean Patent Application No. 10-2019-7033436, dated Sep. 22, 2020 (7 pages).
Japan Patent Office, "Notice of Rejection Ground," issued in connection with Japanese Patent Application No. 2019-557593, dated Dec. 15, 2020 (9 pages).
China National Intellectual Property Administration, "First Office Action," issued in connection with Chinese Application No. 201980011249.3, dated Mar. 22, 2021 (16 pages with translation).
European Patent Office, "Extended Search Report," issued in connection with European Patent Application No. 19751568.7, dated May 7, 2021 (6 pages).
Burr, Geoffrey W et al., "Access devices for 3D crosspoint memory," Journal of Vacuum Science & Technology: Microelectronics and Nanometer Structures, American Institute of Physics, vol. 32, No. 4, Jul. 24, 2014, Melville, NY (23 pages).
Luo, Qing, et al., "Demonstration of 3D Vertical RRAM with Ultra Low-leakage, High-selectivity and Self-compliance memory cells," 2015 IEEE International Electron Devices Meeting, Dec. 7, 2015 (4 pages).
Shenoy, Rohit S., et al., "MIEC (mixed-ionic-electrnoic-conduction)-based access devices for non-volatile crossbar memory arrays," Semiconductor Science Tehnology, IP Publishing Ltd., vol. 29, No. 10, Sep. 18, 2014 (11 pages).
Japanese Patent Office, "Decision to Grant a Patent," issued in connection with Japanese Patent Application No. 2019-557593, dated Jun. 22, 2021 (5 pages with translation).
IPO, "Office Action," issued in connection with ROC (Taiwan) Patent Application No. 108103433, dated Jun. 25, 2021 (10 pages with translation).

(56) References Cited

OTHER PUBLICATIONS

Chen, Yi-Chou, et al., "An Access-Transistor-Free (0T/1R) Non-Volatile Resistance Random Access Memory (RRRAM) Using a Novel Threshold Switching, Self-Rectifying Chalcogenide Device," IEEE International Electron Devices Mtg, Dec. 8-10, 2003 (4 pages).

European Patent Office, "Extended Search Report," issued in connection with European Patent Application No. 19751003.5, dated Sep. 24, 2021 (10 pages).

European Patent Office, "Extended Search Report," issued in connection with European Patent Application No. 19752050.5, dated Oct. 7, 2021 (7 pages).

Lee, F.M., et al., "A Novel Cross Point One-Resistor (0T1R) Conductive Bridge Random Access Memory (CBRAM) with Ultra Low Set/Reset Operation Current," IEEE Symposium on VLSI Technology, Jun. 12-14, 2012, Honolulu, HI, USA, 2012 (pp. 67-68).

Japan Patent Office, "Office Action," issued in connection with Japanese Patent Application No. 2020-541947, dated Aug. 17, 2021 (37 pgs.).

\* cited by examiner

PROGRAMMING ENHANCEMENT IN SELF-SELECTING MEMORY

CROSS REFERENCE

The present application for patent is a divisional of and claims priority to and the benefit of U.S. patent application Ser. No. 15/582,329 by Redaelli et al., entitled "Programming Enhancement in Self-Selecting Memory," filed Apr. 28, 2017, assigned to the assignee hereof, and is expressly incorporated by reference in its entirety herein.

BACKGROUND

The following relates generally to programming enhancement in memory cells and more specifically to programming enhancement in self-selecting memory.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Some types of memory devices may use variations in resistance or voltage drop across a cell to program and sense different logic states. For example, self-selecting memory (SSM) may enhance differences in a threshold voltage of the memory cell between different programmed states. The manner in which a cell is programmed may affect the distribution of various materials that compose the cell, which may affect the ion migration of the cell, which, in turn, may affect a threshold voltage of the cell. The threshold voltage may be related to or indicative of the logic state of the cell. Small variations in threshold voltages between different logic states may therefore affect the accuracy with which cells may be read.

DETAILED DESCRIPTION

Figure 1:
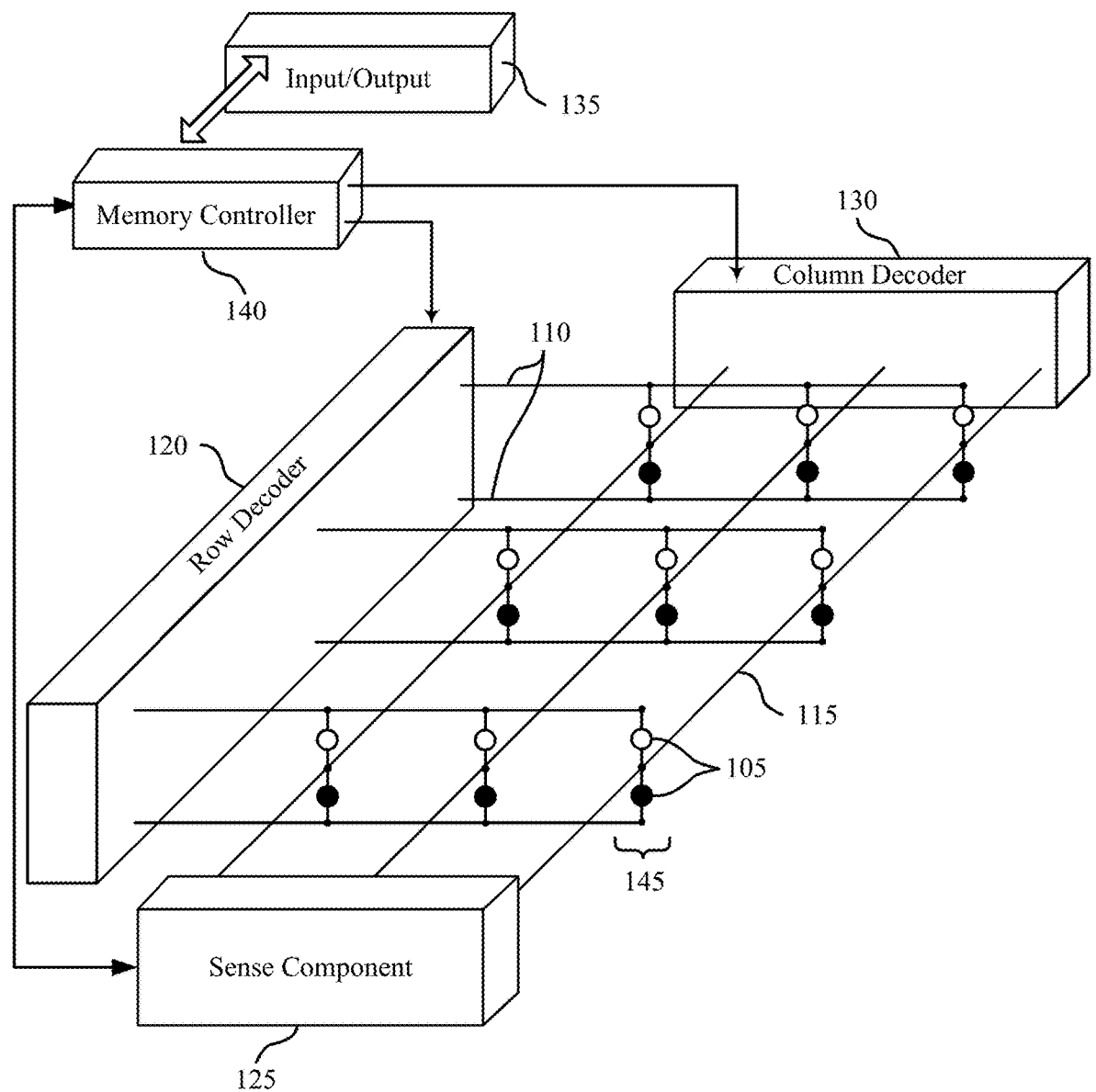
FIG. 1 illustrates an example memory array that supports programming enhancement in self-selecting memory in accordance with examples of the present disclosure.

A self-selecting memory cell with an asymmetric geometry may enhance differences in a threshold voltage of the memory cell between different programmed states. These differences may be due to ion crowding at or near a particular electrode of a cell. This in turn may enhance the sensing window for the cell, which may result in more accurate sensing as compared to cells with a symmetric geometry.

By way of example, when a particular self-selecting memory cell is programmed, elements within the cell separate, causing ion migration. Ions may migrate towards a particular electrode, depending on the given cell's polarity. For example, in an self-selecting memory cell, ions may migrate towards the negative electrode. The memory cell may then be read by applying a voltage across the cell to sense which electrode ions have migrated towards. Increased sensing reliability in a self-selecting memory device may be realized with an asymmetrical geometry that enhances ion crowding at or near a particular electrode. Each memory cell may be configured such that, when programmed, ions within the cell migrate towards one electrode. Due to an asymmetrical geometry, a greater density of ions may build up at or near one electrode. This may create a region with a high density of ion migration and a region with a low density of ion migration within the cell. Depending on the polarity of the memory cell, this concentration of migrating ions may represent a logic "1" or logic "0" state.

The memory cell may then be sensed by applying a voltage across the cell. The resulting current may first encounter the high resistivity region, followed by a band gap, and then the low resistivity region within the cell. This may affect the threshold voltage of the cell because when the cell is activated, current flowing through the cell may encounter both regions. The orientation of the region may be representative of a first or a second logic state of the cell. For example, a high resistivity region at or near a first electrode may be representative of a logic "1" state and a low resistivity region) at or near the first electrode may be representative of a logic "0" state. For example, the orientation of the high resistivity and low resistivity regions may affect the threshold voltage of the cell and thus the logic state of the cell. Such an asymmetrical geometry allows for the memory cell to be more-accurately sensed.

A self-selecting memory device with an asymmetrical geometry may be formed from the perspective of a first access line or a second access line. From the perspective of a first access line, a chalcogenide material may be provided above a first conductive material and a second conductive material may be provided above the chalcogenide material. The first conductive material, second conductive material, and chalcogenide material may then be etched, creating a memory cell with an asymmetrical shape. Dielectric material may be provided about the conductive materials and chalcogenide material.

From the perspective of a second access line, a chalcogenide material may be provided above a first conductive material. A second conductive material may be provided above the chalcogenide material. The chalcogenide material and second conductive material may then be etched, creating a memory cell with a symmetrical shape. Dielectric material may be provided about the chalcogenide material and second conductive material.

Alternatively, a self-selecting memory device with an asymmetrical geometry may also be formed from the perspective of a first access line or a second access line. From the perspective of a first access line, a chalcogenide material may be provided above a first conductive material and a second conductive material may be provided above the chalcogenide material. The first conductive material, second conductive material, and chalcogenide material may then be etched, creating a memory cell with an asymmetrical shape. Dielectric material may be provided about the conductive materials and chalcogenide material.

From the perspective of a second access line, a chalcogenide material may be provided above a first conductive material. A second conductive material may be provided above the chalcogenide material. The chalcogenide material and second conductive material may then be etched, creating a chalcogenide material with an asymmetrical shape. Dielectric material may be provided about the chalcogenide material and second conductive material.

Features of the disclosure introduced above are further described below in the context of a memory array. Self-selecting memory cells with an asymmetric geometry are illustrated and depicted in the context of a cross-point architecture. These and other features of the disclosure are further illustrated by and described with reference to apparatus diagrams, system diagrams, and flowcharts that relate to programming enhancement in self-selecting memory.

FIG. 1 illustrates an example memory array 100 that supports programming enhancement in memory cells in accordance with various examples of the present disclosure. Memory array 100 may also be referred to as an electronic memory apparatus. Memory array 100 includes memory cells 105 that are programmable to store different states. Each memory cell 105 may be programmable to store two states, denoted a logic "0" and a logic "1." In some cases, memory cell 105 is configured to store more than two logic states.

A memory cell 105 may include a chalcogenide material, which may be referred to as a chalcogenide material memory component or memory storage element, that has a variable and configurable threshold voltage or electrical resistance, or both, that is representative of the logic states. In some examples, a threshold voltage of a cell changes depending on a polarity used to program the cell. For example, a self-selecting memory cell programmed with one polarity may have certain resistive properties and thus one threshold voltage. And that self-selecting memory cell may be programmed with a different polarity that may result in different resistive properties of the cell and thus a different threshold voltage. As discussed above, when a self-selecting memory cell is programmed, elements within the cell may separate, causing ion migration. Ions may migrate towards a particular electrode, depending on the given cell's polarity. For example, in a self-selecting memory cell, ions may migrate towards the negative electrode. The memory cell may then be read by applying a voltage across the cell to sense which electrode ions have migrated towards.

In some examples, cell programming may exploit the crystalline structure or atomic configuration to achieve different logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105.

In some cases, a material in the amorphous, or reset, state may have a threshold voltage associated with it—that is, current flows after the threshold voltage is exceed. Thus, if the applied voltage is less than the threshold voltage, no current may flow if the memory element is in the reset state; if the memory element is in the set state, it may not have a threshold voltage (i.e., a threshold voltage of zero) and, thus, a current may flow in response to the applied voltage. In other cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110 and an access line 115. Access lines 110 may also be known as word lines 110, and bit lines 115, respectively. Bit lines 115 may also be known digit lines 115. References to word lines and bit lines, or their analogues, are interchangeable without loss of understanding or operation. Word lines 110 and bit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible; for example, memory cell 105 may be asymmetrically shaped, such as memory cell 105-c with reference to FIG. 3.

In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Upon selecting a memory cell 105, a migration of, for example, selenium (Se) ions may be leveraged to set a logic state of the cell. Additionally or alternatively, ions of other conductive materials may migrate in addition to or in replace of selenium (Se) ions.

For example, a memory cell may be programmed by providing an electric pulse to the cell, which may include a memory storage element that includes selenium. The pulse may be provided via a first access line (e.g., word line 110) or a second access line (e.g., bit line 115), for example. Upon providing the pulse, selenium ions may migrate within the memory storage element, depending on the polarity of the memory cell. Thus, a concentration of selenium relative to the first side or the second side of the memory storage element is based at least in part on a polarity of a voltage between the first access line and the second access line. For asymmetrically shaped memory storage elements, such as those described herein, selenium ions may be more crowded at portions of an element having more area. Selenium-rich portions of the memory storage element may have a higher resistivity and thus may give rise to a higher threshold voltage) than those portions of the element having relatively less selenium. So as compared with symmetrically shaped memory storage elements, the relative resistance between different portions of the memory storage element may be enhanced.

To read the cell, a voltage may be applied across memory cell 105 and the resulting current or the threshold voltage at which current begins to flow may be representative of a logic "1" or a logic "0" state. The crowding of selenium ions at one or the other ends of memory storage element may affect the resistivity and/or the threshold voltage, resulting in greater distinctions in cell response between logic states.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may be connected to or in electronic communication with column decoder 130 or row decoder 120.

A memory cell 105 may be programmed, or written, by similarly activating the relevant word line 110 and bit line 115—i.e., a logic value may be stored in the memory cell 105. Column decoder 130 or row decoder 120 may accept data, for example input/output 135, to be written to the memory cells 105. In the case of phase change memory or self-selecting memory, a memory cell 105 may be written by heating the memory storage element, for example, by passing a current through the memory storage element. Depending on the logic state written to memory cell 105—e.g., logic "1" or logic "0"—selenium ions may crowd at or near a particular electrode. For example, dependent on the polarity of memory cell 105, ion crowding at or near a first electrode may result in a first threshold voltage representative of a logic "1" state and ion crowding at or near a second electrode may result in a second threshold voltage, different from the first, representative of a logic "0" state. The first threshold voltage and second threshold voltage may, for example, be determined during a read operation performed in a predetermined polarity. The difference between the first and second threshold voltages may be more pronounced in a memory storage element that is asymmetric, including those described with reference to FIG. 3.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or self-selecting memory, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or self-selecting memory cells may have beneficial properties that may result in improved performance relative to other memory architectures. For example, PCM and/or self-selecting memory may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltages or currents used during the operation of memory array 100. For example, it may apply discharge voltages to a word line 110 or bit line 115 after accessing one or more memory cells 105.

In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
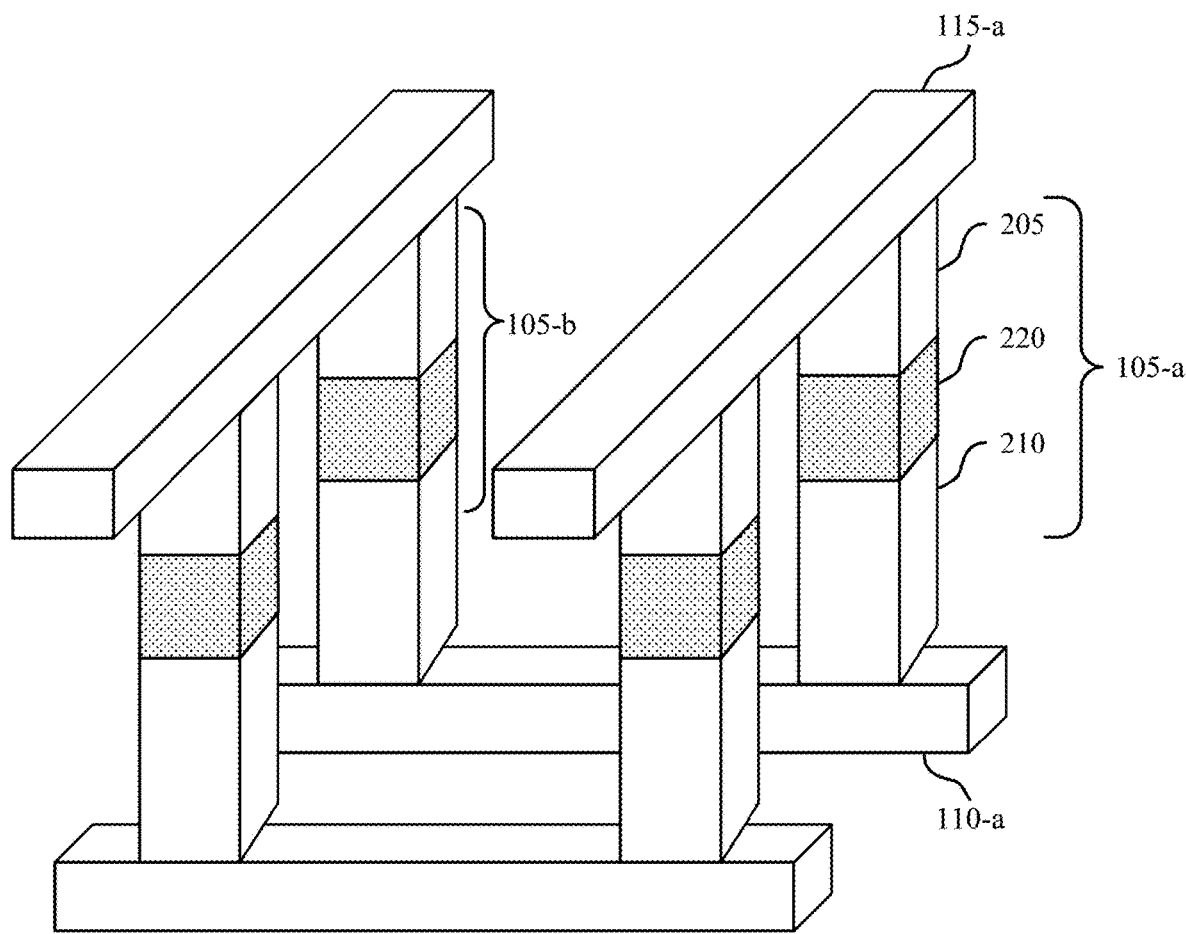
FIG. 2 illustrates an example memory array that supports programming enhancement in self-selecting memory in accordance with examples of the present disclosure.

FIG. 2 illustrates an example memory array 200 that supports reading and writing non-volatile memory cells and programming enhancement in memory cells in accordance with various examples of the present disclosure. Memory array 200 may be an example of memory array 100 with reference to FIG. 1.

Memory array 200 may include memory cell 105-*a*, memory cell 105-*b*, word line 110-*a*, and bit line 115-*a*, which may be examples of a memory cell 105, word line 110, and bit line 115, as described with reference to FIG. 1. Memory cell 105-*a* may include electrode 205 (e.g., top electrode), electrode 210 (e.g., a bottom electrode), and memory storage element 220, which may be referred to as a chalcogenide glass memory storage element and may contain or may be a self-selecting memory component. The logic state of memory cell 105-*a* may be based on at least one characteristic of memory storage element 220. Memory cell 105-*b* may include a top electrode, bottom electrode, and memory storage element similar to memory cell 105-*a*. Electrode 205 may be referred to as a top electrode and electrode 210 may be referred to as a bottom electrode. In some cases, a three-dimensional (3D) memory array may be formed by stacking multiple memory arrays 200 on one another. The two stacked arrays may, in some examples, have common conductive lines so each level may share word line 110-*a* or bit line 115-*a*. Memory cell 105-*a* may depict a target memory cell—i.e., a target of a sensing operation, as described elsewhere herein.

The architecture of memory array 200 may be referred to as a cross-point architecture. It may also be referred to as a pillar structure. For example, as shown in FIG. 2, a pillar may be in contact with a first conductive line (e.g., access line such as word line 110-*a*) and a second conductive line (e.g., access line such as bit line 115-*a*). The pillar may comprise memory cell 105-*a*, where memory cell 105-*a* includes a first electrode (e.g., top electrode 205), memory storage element 220, and a second electrode (e.g., bottom electrode 210). Memory storage element 220 may be an asymmetrical shape (e.g., memory storage element 220-*a* as described with reference to FIG. 3). This asymmetrical shape may cause ion crowding at the top electrode 205 or bottom electrode 210, depending on the polarity of memory cell 105-*a*. Ion crowding at top electrode 205 or bottom electrode 210 may allow for more-accurate sensing of memory cell 105-*a*, as described above.

The cross-point or pillar architecture depicted in FIG. 2 may offer relatively high-density data storage with lower production costs compared to other memory architectures. For example, the cross-point architecture may have memory cells with a reduced area and thus an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

In some examples, memory array 200 may be operated using a positive voltage source and the magnitude of an intermediary voltage is between the magnitude of the positive voltage source and a virtual ground. In some examples, both bit line access voltage and word line access voltage are maintained at an intermediary voltage prior to an access operation of memory cell 105-*a*. And during an access operation, bit line access voltage may be increased (e.g., to a positive supply rail) while word line access voltage may be simultaneously decreased (e.g., to a virtual ground), generating a net voltage across memory cell 105-*a*. The threshold voltage at which current begins to flow through cell 105-*a* as a result of applying a voltage across cell 105-*a* may be a function of ion migration towards top electrode 205 or bottom electrode 210, which in turn may vary with the shape of memory storage element 220*a*.

Memory storage element 220 may, in some cases, be connected in series between a first conductive line and a second conductive line, for example, between word line 110-*a* and bit line 115-*a*. For example, as depicted in FIG. 2, memory storage element 220 may be located between top electrode 205 and bottom electrode 210; thus, memory storage element 220 may be located in series between bit line 115-*a* and word line 110-*a*. Other configurations are possible. As mentioned above, memory storage element 220 may have a threshold voltage such that a current flows through memory storage element 220 when the threshold voltage is met or exceeded. The threshold voltage may depend on the programming of cell 105-*a* and the shape of memory storage element 220.

Memory storage element 220 may be configured in an asymmetrical shape to facilitate ion crowding at or near top electrode 205 or bottom electrode 210. For example, memory storage element 220 may be in the shape of a trapezoidal prism and a cross-section of memory storage element 220 may include a trapezoid. Alternatively, memory storage element 220 may be a frustum. A frustum, as used herein, includes a shape of or resembling the portion of a cone or pyramid with the upper portion removed, or a shape of or resembling the portion of a cone or pyramid between a first plane that intercepts the cone or pyramid below the top and a second plane at or above the base. Memory storage element 220 may be arranged in a series configuration between the first access line 110-a and second access line 115-a. Memory storage element 220 may include a first chalcogenide glass comprising selenium. In some examples, memory storage element 220 comprises a composition of at least one of selenium, arsenic (As), tellurium (Te), silicon (Si), germanium (Ge), or antimony (Sb). When a voltage is applied across the memory storage element 220 (or when there is a voltage difference between top electrode 205 and bottom electrode 210, ions may migrate toward one or the other electrode. For example, Te and Se ions may migrate towards a positive electrode and Ge and As ions may migrate toward a negative electrode. Memory storage element 220 may also serve as a selector device. This type of memory architecture may be referred to as self-selecting memory.

Memory array 200 may be made by various combinations of material formation and removal. For example, layers of material may be deposited that correspond to word line 110-a, bottom electrode 210, memory storage element 220, and top electrode 205. Material may be selectively removed to then create the desired features, such as the structure depicted in FIG. 3. For example, features may be defined using photolithography to pattern a photoresist and then material may be removed by techniques such as etching. Bit lines 115-a may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials. Exemplary methods of forming such arrays are described with reference to FIGS. 7 and 8.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Figure 3:
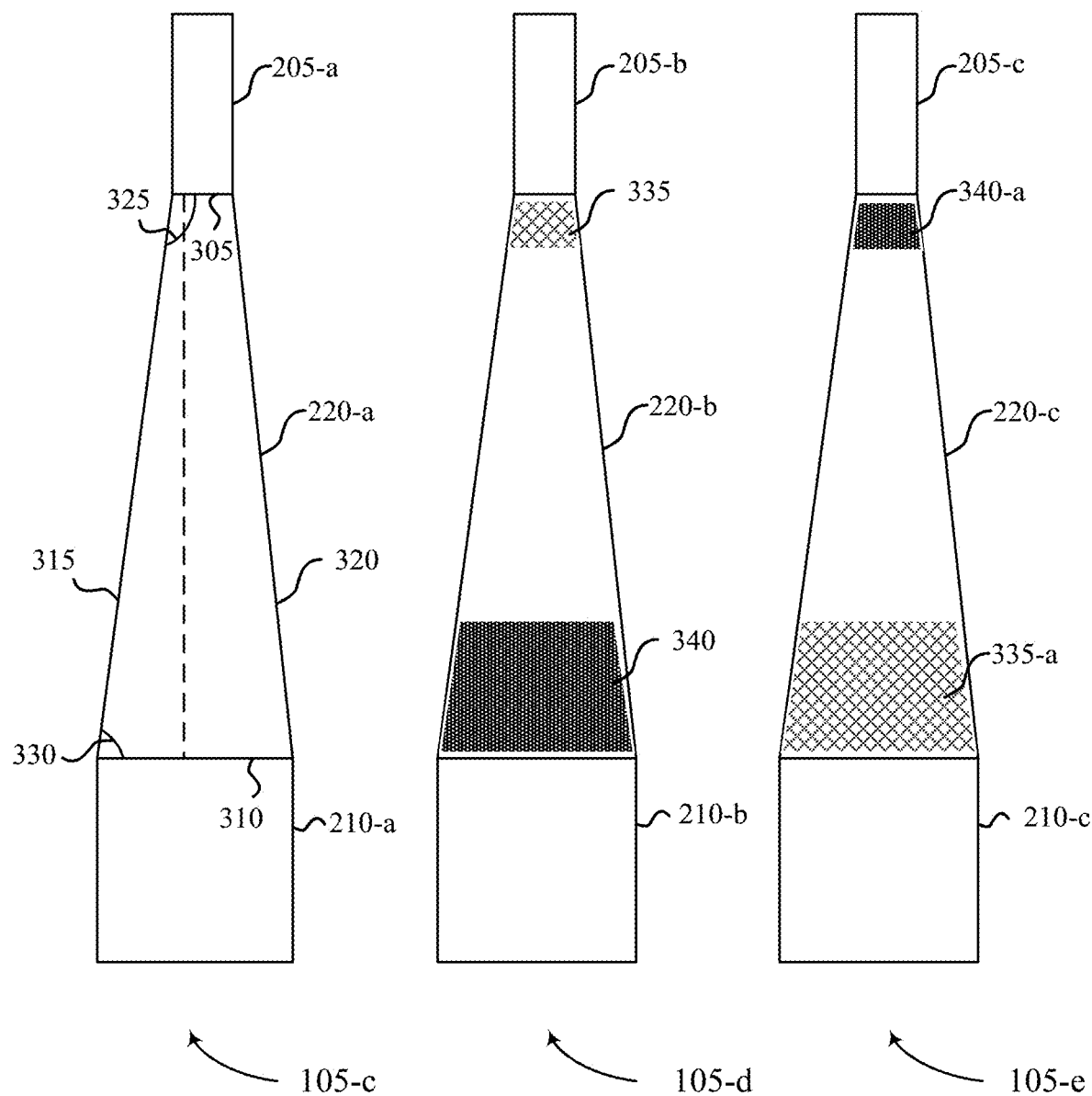
FIG. 3 illustrates an example memory device that supports programming enhancement in accordance with examples of the present disclosure.

FIG. 3 illustrates example memory cells 105-c, 105-d, and 105-e that support programming enhancement in memory cells in accordance with examples of the present disclosure. Memory cell 105-c, for example, illustrates an asymmetrical memory storage element 220-a coupled to top electrode 205-a and bottom electrode 210-a. Memory cells 105-d and 105-e illustrate similar features. In some examples, top electrode 205-a may be referred to as a bottom electrode and bottom electrode 210-a may be referred to as a top electrode.

Memory storage element 220-a includes a first side 305 (e.g., a first surface), a second side 310 (e.g., a second surface), a third side 315 (e.g., a third surface), and a fourth side 320 (e.g., a fourth surface). The second surface 310 may have a greater area than the first surface 305. The first side 305 may be opposite the second side 310 and the third side 315 may be opposite the fourth side 320. Further, the first side 305 and the third side 315 may form an obtuse angle 325 and the second side 310 and the third side 315 may form an acute angle 330. Additionally, the first side 305 and the fourth side 320 may form an obtuse angle and second side 310 and the fourth side 320 may form an acute angle. Memory storage elements 220-b and 220-c may be shaped similarly.

Memory storage element 220-a may be coupled to top electrode 205-a and bottom electrode 210-a. A portion of the first electrode (e.g., top electrode 205-a) may be in contact with the first side 305 and have less area than a portion of the second electrode (e.g., bottom electrode 210-a) that may be in contact with the second side 310.

Memory cell 105-c may be programmed by providing a pulse to memory storage element 220-a. Prior to providing the pulse, ions within memory element 220-a may be in equilibrium. That is, ions within memory element 220-a might not have migrated towards the top electrode 205-a or the bottom electrode 210-a relative to a starting position and a net flux of atoms may be zero. The pulse may cause ions within the memory storage element 220-a (e.g., selenium ions) to migrate and may be applied via top electrode 205-a and bottom electrode 210-a. This migration of ions within memory storage element 220-a may be a function of the polarity of the applied pulse. For example, applying a first pulse, representative of logic "1" may cause the ions to migrate towards bottom electrode 210-a. In some examples, applying a second pulse, representative of logic "0" may cause the ions to migrate towards top electrode 205-a. Regardless of the direction of ion migration, a high resistivity region and low resistivity region are created within the memory storage element 220-a. The high resistivity region and low resistivity region may be representative of a first threshold voltage and a second threshold voltage, respectively.

Memory cell 105-c may be read by applying a voltage across memory storage element 220-a. The voltage may be applied across memory storage element 220-a in a predetermined polarity. The threshold voltage of memory storage element 220-a and/or resulting current through 220-a may depend on the location of a high resistivity region and low resistivity region within memory storage element 220-a due to the ion migration. The resistivity of the region may be based on the composition of memory storage element 220-a. For example, a high resistivity region of a memory storage element 220-a containing selenium (Se) may be different than a high resistivity region of a memory storage element 220-a containing arsenic (As). The relative orientations of the high resistivity region and low resistivity region may affect the threshold voltage. So some of the ions (e.g., selenium ions) may have impact a threshold voltage, and thus the position of such ions may affect a read operation for a memory cell 105-c.

Additionally, a polarity used to program the memory storage element 220-a may affect a location of the high resistivity region or the low resistivity relative to a particular electrode. So the threshold voltage may vary depending on a polarity used to program memory storage element 220-a. In some examples, the voltage may be applied in a same direction regardless of the programmed state (e.g., logic "1" or logic "0") of the memory storage element 220-a. For example, the voltage may be applied to the negative electrode (e.g., top electrode 205-a), which may induce an avalanche injection.

Memory cell 105-d depicts high resistivity region 335 and low resistivity region 340, which may be representative of a high ion concentration region and a low ion concentration region, respectively. Additionally, memory cell 105-*e* illustrates high resistivity region 335-*a* and low resistivity region 340-*a*. To sense the logic state of the memory storage element (e.g., memory storage element 220-*b*), a voltage may be applied to top electrode (e.g., top electrode 205-*b*). For example, in memory cell 105-*d* a voltage may be applied to top electrode 205-*a*. The resulting current may then encounter high resistivity region 335 and low resistivity region 340, which may be representative of a high ion concentration region and a low ion concentration region, respectively. The orientation of these resistive regions—high resistivity region 335 at or near top electrode 205-*b* and low resistivity region 340 at or near bottom electrode 210-*b*—and the threshold voltage associated with each orientation may be representative of a first stored logic state (e.g., logic "1") of memory cell 105-*d*. Additionally, for example, memory cell 105-*e* may also be sensed by applying a voltage to the top electrode 205-*c*. The resulting current may then encounter low resistivity region 340-*a* and high resistivity region 335-*a*. The opposite orientation of these resistive regions—high resistivity region 335-*a* at or near bottom electrode 210-*c* and low resistivity region 340-*a* at or near top electrode 210-*c*—and the threshold voltage associated with each orientation may be representative of a first stored logic state (e.g., logic "0") of memory cell 105-*e*.

In an additional example, any of memory cells 105-*c*, 105-*d*, and 105-*e* may be configured as a second or multiple deck in a memory array. For example, a common access line (e.g., bit line 115-*a* of FIG. 2) may be shared by two decks of memory cells. In this example, the geometry of a memory cell in the first deck may be opposite of the geometry of a memory cell in a second deck. Alternatively stated, for example, the top electrode (e.g., top electrode 205-*a*) in a first deck may oppose the same electrode in a second deck. Both electrodes may share a common access line. Alternatively, each deck may be coupled to an independent access line. In this example, the geometry of a memory cell in the first deck may be identical to the geometry of a memory cell in a second deck.

Figure 4:
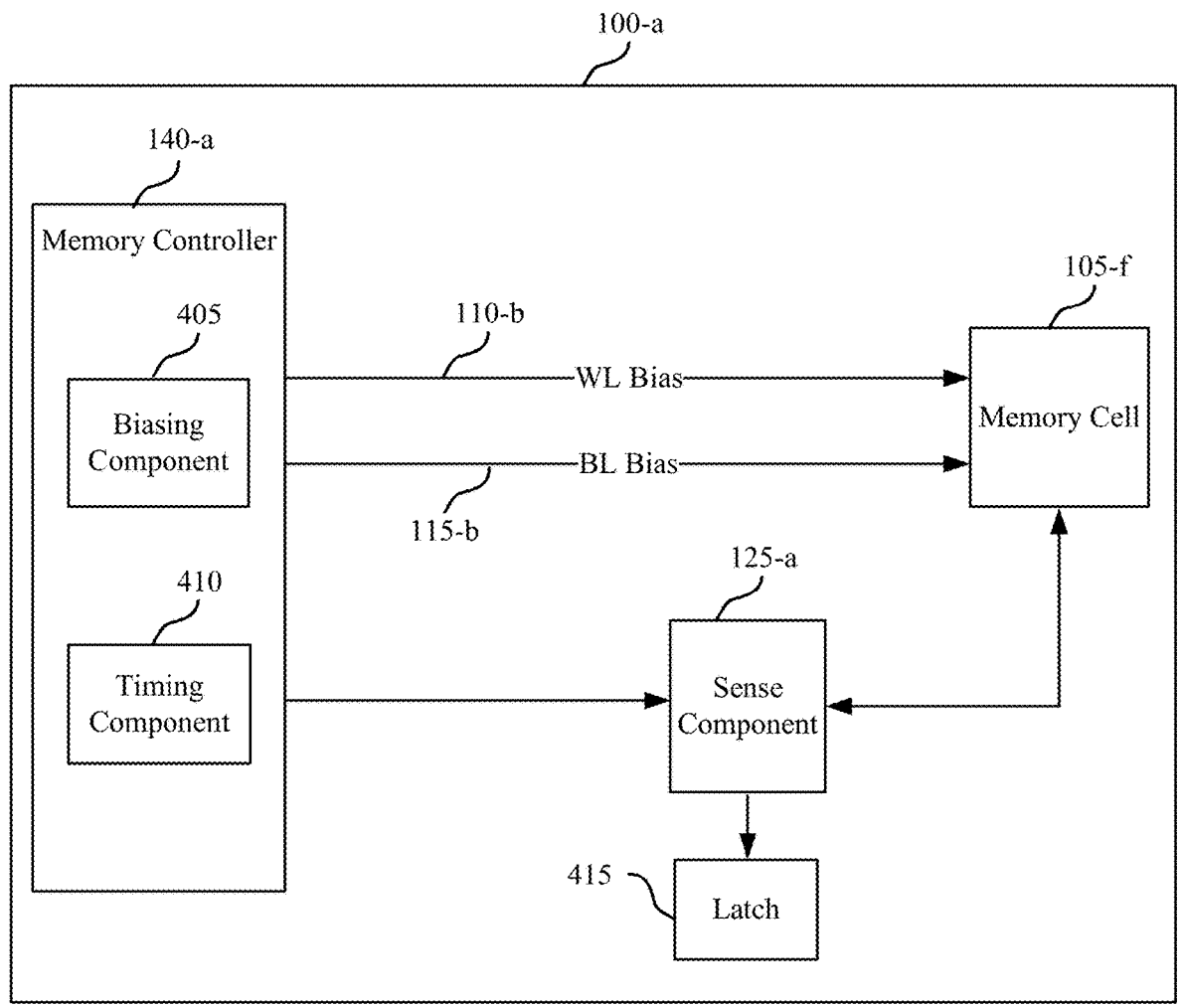
FIG. 4 illustrates an example memory array that supports programming enhancement in self-selecting memory in accordance with examples of the present disclosure.

FIG. 4 shows an example block diagram 400 of a memory array 100-*a* that supports programming enhancement in memory cells in accordance with examples of the present disclosure. Memory array 100-*a* may be referred to as an electronic memory apparatus, and may be an example of a component of a memory controller 140 as described with reference to FIG. 1.

Memory array 100-*a* may include one or more memory cells 105-*f*, memory controller 140-*a*, word line 110-*b*, sense component 125-*a*, digit line 115-*b*, and latch 415. These components may be in electronic communication with each other and may perform one or more of the functions described herein. In some cases, memory controller 140-*a* may include biasing component 405 and timing component 410. Memory controller 140-*a* may be in electronic communication with word line 110-*b*, digit line 115-*b*, and sense component 125-*a*, which may be examples of word line 110, digit line 115, and sense component 125, described with reference to FIGS. 1 and 2. In some cases, sense component 125-*a* and latch 415 may be components of memory controller 140-*a*.

Memory cell 105-*f* may include a memory storage element with an asymmetric shape. For example, memory cell 105-*f* may be an example of a memory cell 105 described with reference to FIG. 3.

In some examples, digit line 115-*b* is in electronic communication with sense component 125-*a* and memory cell 105-*f*. A logic state (e.g., a first or second logic state) may be written to memory cell 105-*f*. Word line 110-*b* may be in electronic communication with memory controller 140-*a* and memory cell 105-*f*. Sense component 125-*a* may be in electronic communication with memory controller 140-*a*, digit line 115-*b*, and latch 415. These components may also be in electronic communication with other components, both inside and outside of memory array 100-*a*, in addition to components not listed above, via other components, connections, or busses.

Memory controller 140-*a* may be configured to activate word line 110-*b* or digit line 115-*b* by applying voltages to those various nodes. For example, biasing component 405 may be configured to apply a voltage to operate memory cell 105-*f* to read or write memory cell 105-*f* as described above. In some cases, memory controller 140-*a* may include a row decoder, column decoder, or both, as described with reference to FIG. 1. This may enable memory controller 140-*a* to access one or more memory cells 105-*f*. Biasing component 405 may provide a voltage for the operation of sense component 125-*a*.

In some cases, memory controller 140-*a* may perform its operations using timing component 410. For example, timing component 410 may control the timing of the various word line selections or plate biasing, including timing for switching and voltage application to perform the memory functions, such as reading and writing, discussed herein. In some cases, timing component 410 may control the operations of biasing component 405.

Upon determining a logic state of memory cell 105-*f*, sense component 125-*a* may store the output in latch 415, where it may be used in accordance with the operations of an electronic device that memory array 100-*a* is a part. Sense component 125-*a* may include a sense amplifier in electronic communication with the latch and memory cell 105-*f*.

In some examples memory controller 140-*a* may include means for increasing a local concentration of a chemical element at a first surface of a chalcogenide material memory storage component to store a first logic value and means for increasing a concentration of the element at a second surface of the chalcogenide material memory storage component to store a second logic value different from the first value, wherein the first surface is opposite the second surface.

In additional examples of the method and apparatus described above, the second surface may have an area greater than an area of the first surface. Further, the concentration of the chemical element at the first surface may be greater than the concentration of the chemical element at the second surface. Some examples of the method and apparatus described above may further include processes, features, means, or instructions for applying a read pulse to the chalcogenide memory storage component and determining whether the first logic value or the second logic value may have been stored at the chalcogenide material memory component based at least in part on applying the read pulse. Additionally, the chemical element may be a cation and the pulse may be applied with a negative polarity. Some examples of the method and apparatus described above may further include processes, features, means, or instructions for increasing a local concentration of a different chemical element at the second surface of the memory storage component based at least in part on increasing the concentration of the chemical at the first surface.

Memory controller 140-*a*, or at least some of its various sub-components may be implemented in hardware, software executed by a processor, firmware, or any combination thereof. If implemented in software executed by a processor, the functions of the memory controller 140-*a* and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 140-*a* and/or at least some of its various sub-components may be physically located at various positions, including being distributed such that portions of functions are implemented at different physical locations by one or more physical devices. In some examples, memory controller 140-*a* and/or at least some of its various sub-components may be a separate and distinct component in accordance with various examples of the present disclosure. In other examples, memory controller 140-*a* and/or at least some of its various sub-components may be combined with one or more other hardware components, including but not limited to a receiver, a transmitter, a transceiver, one or more other components described in the present disclosure, or a combination thereof in accordance with various examples of the present disclosure.

Figure 5:
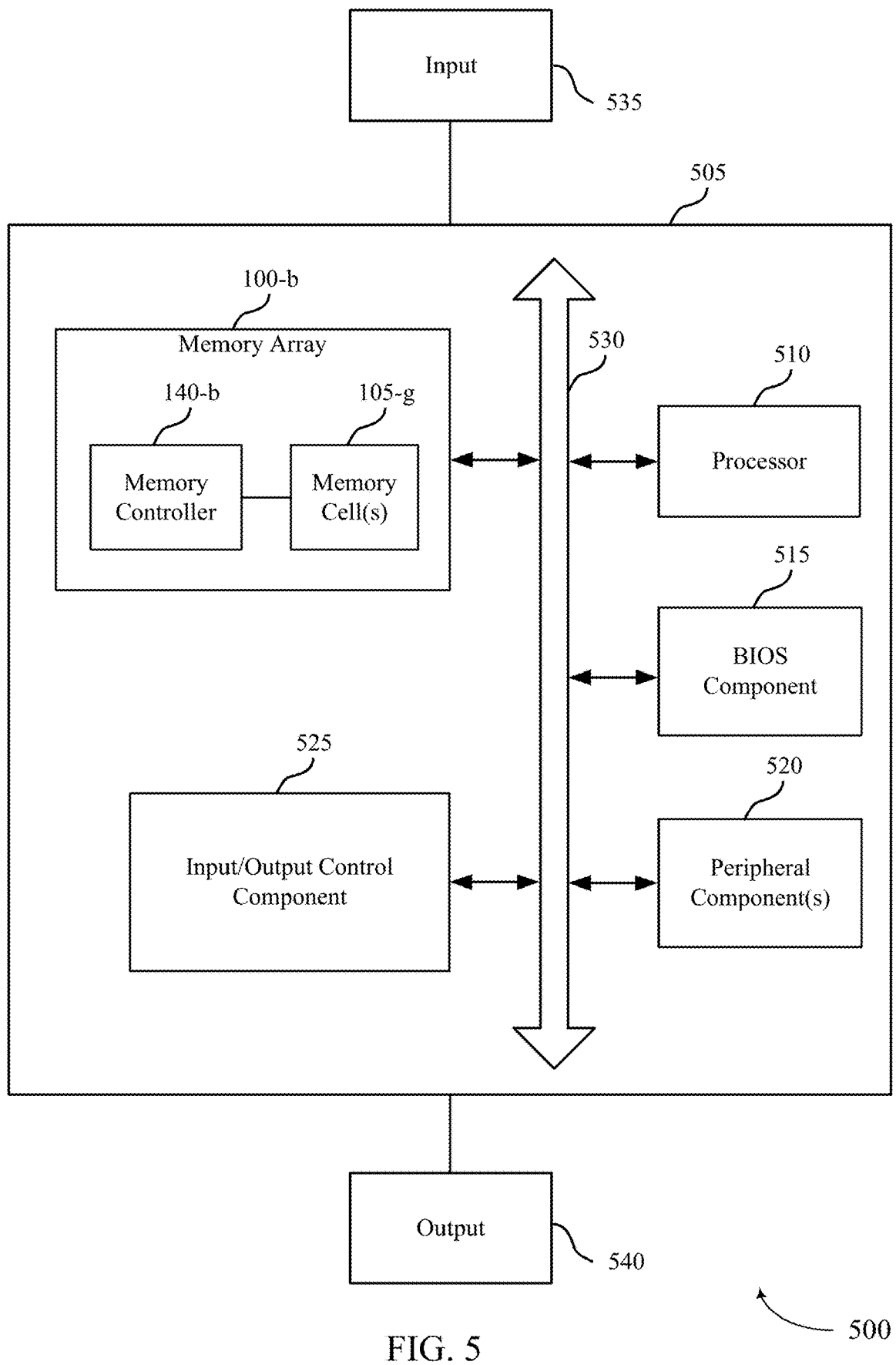
FIG. 5 illustrates a device, including a memory array, that supports programming enhancement in self-selecting memory in accordance with examples of the present disclosure.

FIG. 5 shows an example diagram of a system 500 including a device 505 that supports programming enhancement in memory cells in accordance with various examples of the present disclosure. Device 505 may be an example of or include the components of memory controller 140 as described above, with reference to FIG. 1. Device 505 may include components for bi-directional voice and data communications including components for transmitting and receiving communications, including memory array 100-*b* that includes memory controller 140-*b* and memory cells 105-*g*, basic input/output system (BIOS) component 515, processor 510, I/O controller 525, and peripheral components 520. These components may be in electronic communication via one or more busses (e.g., bus 530).

Memory cells 105-*g* may store information (i.e., in the form of a logical state) as described herein. Memory cells 105-*g* may be self-selecting memory cells with a memory storage element as described with reference to FIG. 3, for example.

BIOS component 515 may be a software component that includes BIOS operated as firmware, which may initialize and run various hardware components. BIOS component 515 may also manage data flow between a processor and various other components, for example, peripheral components, input/output control component, etc. BIOS component 515 may include a program or software stored in read only memory (ROM), flash memory, or any other non-volatile memory.

Processor 510 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 510 may be configured to operate a memory array using a memory controller. In other cases, a memory controller may be integrated into processor 510. Processor 510 may be configured to execute computer-readable instructions stored in a memory to perform various functions (e.g., functions or tasks supporting programming enhancement in self-selecting memory).

I/O controller 525 may manage input and output signals for device 505. I/O controller 525 may also manage peripherals not integrated into device 505. In some cases, I/O controller 525 may represent a physical connection or port to an external peripheral. In some cases, I/O controller 525 may utilize an operating system such as iOS®, ANDROID®, MS-DOS®, MS-WINDOWS®, OS/2®, UNIX®, LINUX®, or another known operating system.

Peripheral components 520 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 535 may represent a device or signal external to device 505 that provides input to device 505 or its components. This may include a user interface or an interface with or between other devices. In some cases, input 535 may be managed by I/O controller 525, and may interact with device 505 via a peripheral component 520.

Output 540 may also represent a device or signal external to device 505 configured to receive output from device 505 or any of its components. Examples of output 540 may include a display, audio speakers, a printing device, another processor or printed circuit board, etc. In some cases, output 540 may be a peripheral element that interfaces with device 505 via peripheral component(s) 520. In some cases, output 540 may be managed by I/O controller 525.

The components of device 505 may include circuitry designed to carry out their functions. This may include various circuit elements, for example, conductive lines, transistors, capacitors, inductors, resistors, amplifiers, or other active or inactive elements, configured to carry out the functions described herein. Device 505 may be a computer, a server, a laptop computer, a notebook computer, a tablet computer, a mobile phone, a wearable electronic device, a personal electronic device, or the like. Or device 505 may be a portion or component of such a device.

Figure 6:
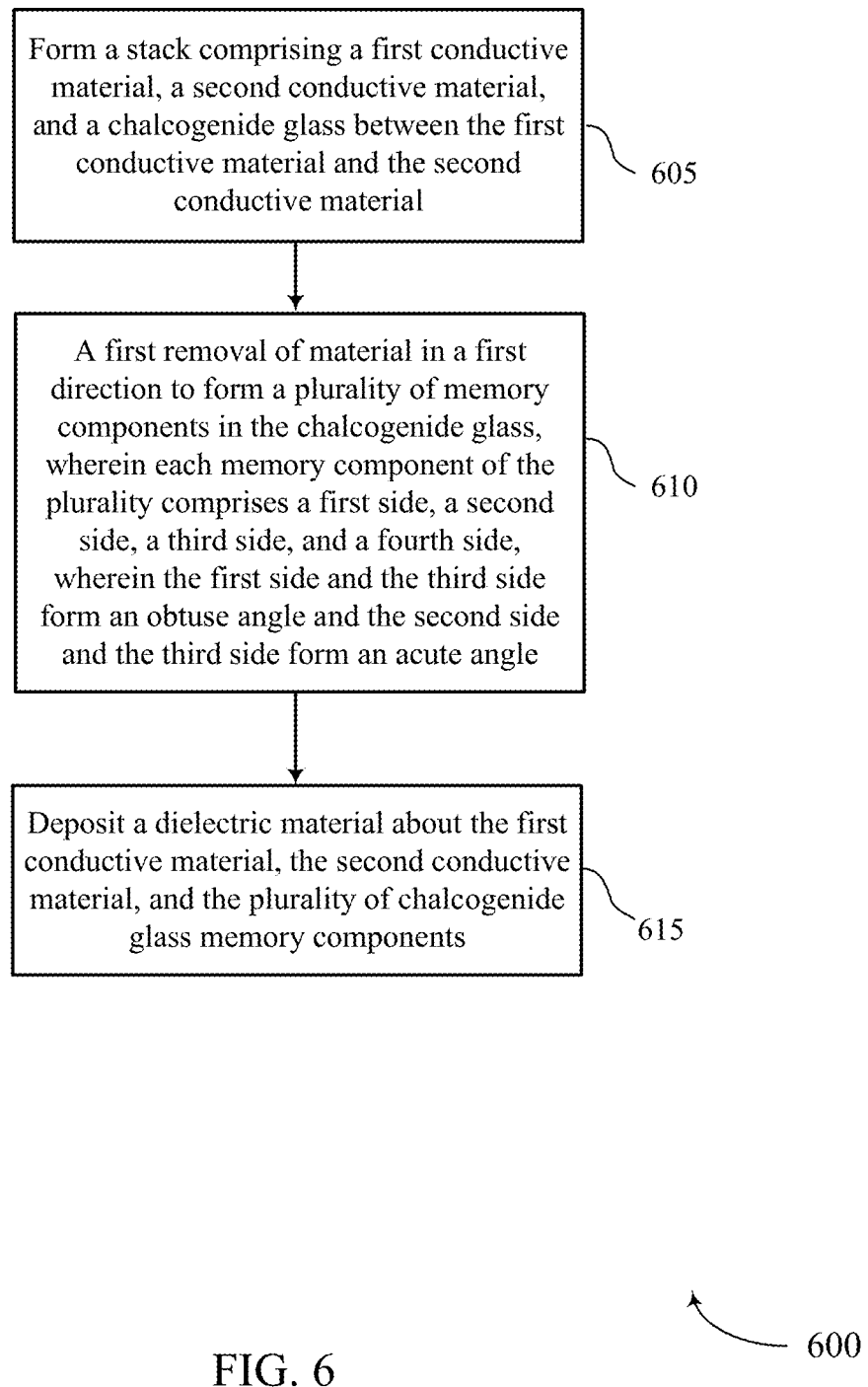
FIG. 6 is a flowchart that illustrates a method or methods for operating a self-selecting memory device that supports programming enhancement in accordance with examples of the present disclosure.

FIG. 6 shows a flowchart illustrating a method 600 to form a memory device that supports programming enhancement in memory cells in accordance with examples of the present disclosure. The method of forming may include those described with reference to FIGS. 7 and 8. For example, materials or components may be formed through various combinations of material deposition and removal. In some cases material formation or removal may include one or more photolithography or etching steps no denoted explicitly.

At block 605 the method may include forming a stack that includes a first conductive material, a second conductive material, and chalcogenide material (e.g., chalcogenide glass) between the first conductive material and the second conductive material, as described with reference to FIG. 7. In some examples, the chalcogenide glass may include at least one of: selenium, arsenic, tellurium, silicon, or germanium.

At block 610 the method may include a first removal of material in a first direction to form a plurality of memory components in the chalcogenide glass. Each memory component of the plurality may comprise a first side, a second side, a third side, and a fourth side. The first side and the third side may form an obtuse angle and the second side and the third side may form an acute angle, as described with reference to FIG. 7. In some examples, the first removing of materials may include etching beginning at the first conductive material. In another example, the first removing of materials may include etching beginning at the second conductive material.

At block 615 the method may include forming a dielectric material about the first conductive material, the second conductive material, and the plurality of chalcogenide glass memory components, as described with reference to FIG. 7. In some examples, the first removing of material may result in the first conductive material having a first dimension in a plane parallel to the first side and the second conductive material having a second dimension in a plane parallel to the second side. The first dimension may be less than the second dimension. In another example, the first dimension of the first conductive material may be equal to a first dimension of the first side and the second dimension of the second side may be equal to a first dimension of the second side. In a further example, the dielectric material may comprise at least one of: silicon nitride, silicon oxide, aluminum oxide, or afnium oxide.

In further examples, the method may also include forming a first access line to the first conductive material and forming a second access line to the second conductive material. The first conductive material may be different from the second conductive material. In another example, the method may include a second removing of material in a second direction. The second removing of material may result in a plurality of memory components having a fifth side, a sixth side, a seventh side, and an eighth side. The fifth side and the seventh side may form an obtuse angle and the sixth side and the seventh side may form an acute angle. The second removing of material may result in the first conductive material having a second dimension in a plane parallel to the fifth side. Additionally, the second removing of material may result in the second conductive material having a third dimension in a plane parallel to the fifth side. The third dimension may be greater than the second dimension.

Figure 7:
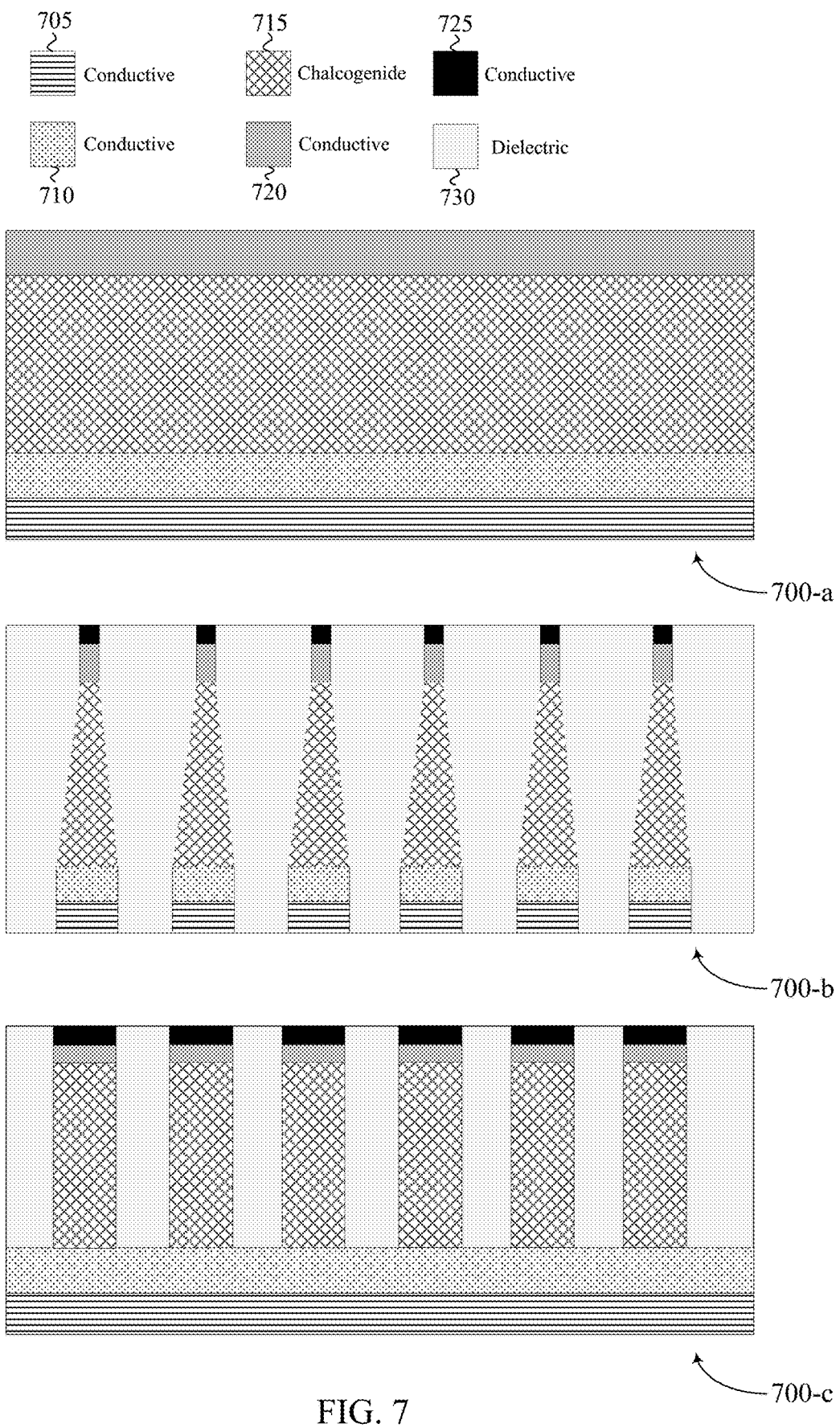
FIGS. 7 and 8 illustrate example process flows for forming a self-selecting memory device that supports programming enhancement in accordance with examples of the present disclosure.

FIG. 7 illustrates an example process flow for forming a self-selecting memory device that supports programming enhancement, which may include steps 700-*a*, 700-*b*, and 700-*c*, in accordance with examples of the present disclosure. The resulting memory device may be an example of the memory cells and architecture that include memory cells 105 described with reference to FIGS. 1-3.

Processing step(s) 700-*a* includes formation of a first conductive material 705, second conductive material 710, chalcogenide material 715, and third conductive material 720. Various techniques may be used to form materials or components shown processing step 700-*a*. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. The method at block 605 may be an example of processing step(s) 700-*a*.

At processing step(s) 700-*a* second conductive material 710 may be deposited above first conductive material 705. Chalcogenide material 715 may then be deposited above second conductive material 710. Third conductive material 720 may then be deposited above chalcogenide material 715 such that chalcogenide material 715 is located between second conductive material 710 and third conductive material 720. First conductive material 705 may include tungsten (W), second conductive material 710 and third conductive material 720 may include carbon (C), and chalcogenide material 715 may include a composition of at least one of: selenium, arsenic, tellurium, silicon, or germanium. In some examples, additional interface materials may be deposited between first conductive material 705 and second conductive material 710, and between second conductive material 710 and third conductive material 715.

At processing steps 700-*b* and 700-*c*, a removal of first conductive material 705, second conductive material 710, chalcogenide material 715, and third conductive material 720 may occur. The removal of materials may result in a plurality of memory cells with an asymmetrical shape (e.g., memory cell 105-*c* described with reference to FIG. 3). Such a removal of materials may result in memory cells with an asymmetrical shape in a first direction only. For example, the removal of materials may result in memory cells with an asymmetrical shape in a first direction, as illustrated in processing step 700-*b*, and a symmetrical shape in a second direction, as illustrated in processing step 700-*c*. The methods at block 610 and block 615 may be an example of processing step(s) 700-*b* and 700-(*c*).

For example, processing step 700-*b* may depict a plurality of memory cells viewed from a first direction and processing step 700-*c* may depict a plurality of memory cells viewed from a second direction. The second direction may be orthogonal to the first direction. The material removed at processing steps 700-*b* and 700-*c* may be removed using a number of techniques, which may include, for example, chemical etching (also referred to as "wet etching"), plasma etching (also referred to as "dry etching"), or chemical-mechanical planarization. The etching may begin at first conductive material 705 or third conductive material 720 and may be performed using a dot-patterned mask. Additionally, the etching may result in chalcogenide material 715 having a first orientation or a second orientation. The second orientation may be opposite of the first orientation (e.g., flipped). After the removal of materials, dielectric material 730 may be deposited about the plurality of memory cells. Dielectric material may include at least one of: silicon nitride, silicon oxide, aluminum oxide, or afnium oxide. Finally, fourth conductive 725 material may be deposited above third conductive material 720. Fourth conductive material may be representative of a bit line (e.g., bit line 115-*a* of FIG. 2). One or more etching steps may be employed. Those skilled in the art will recognize that, in some examples, steps of a process described with a single exposure and/or etching step may be performed with separate etching steps and vice versa.

Figure 8:
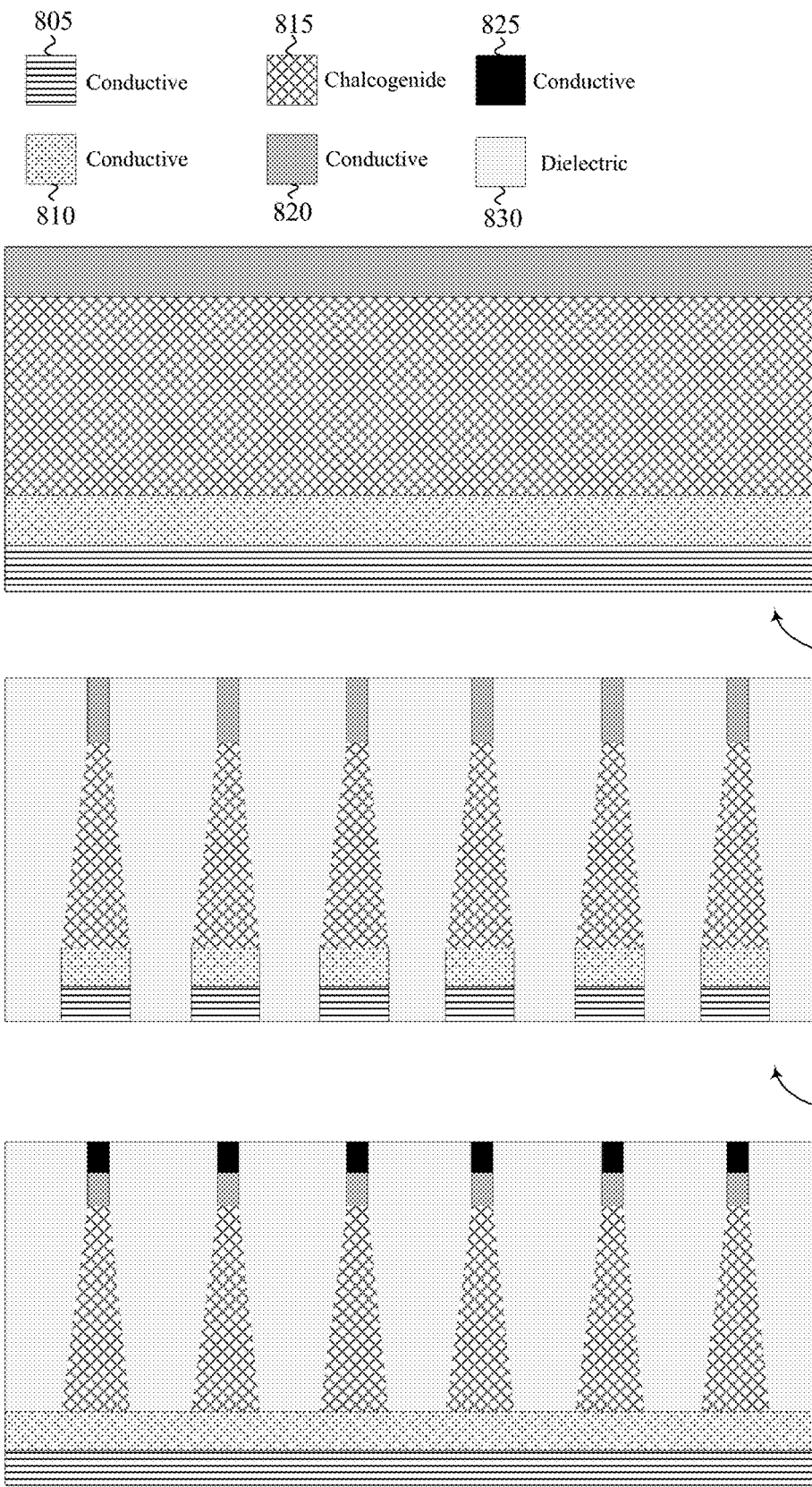

FIG. 8 illustrates an example process flow for forming a self-selecting memory device that supports programming enhancement, which may include steps 800-*a*, 800-*b*, and 800-*c*, in accordance with examples of the present disclosure. The resulting memory device may be an example of the memory cell architecture in memory cell 105-*c* with reference to FIG. 2 and memory array 100 with reference to FIG. 1.

Processing step 800-*a* includes formation of a first conductive material 805, second conductive material 810, chalcogenide material 815, and third conductive material 820. Various techniques may be used to form materials or components shown processing step 800-*a*. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques.

At processing step 800-*a* second conductive material 810 may be deposited above first conductive material 805. Chalcogenide material 815 may then be deposited above second conductive material 810. Third conductive material 820 may then be deposited above chalcogenide material 815 such that chalcogenide material 815 is located between second conductive material 810 and third conductive material 820. First conductive material 805 may include W, second conductive material 810 and third conductive material 820 may include C, and chalcogenide material 815 may include a composition of at least one of: selenium, arsenic, tellurium, silicon, or germanium. In some examples, additional interface materials may be deposited between first conductive material 805 and second conductive material 810, and between second conductive material 810 and third conductive material 815.

At processing steps 800-*b* and 800-*c*, a removal of first conductive material 805, second conductive material 810, chalcogenide material 815, and third conductive material 820 may occur. The removal of materials may result in a plurality of memory cells with an asymmetrical shape (e.g., memory cell 105-*c* described with reference to FIG. 3). Such a removal of materials may result in memory cells with an asymmetrical shape in a first direction and a second direction. For example, processing step 800-*b* may depict a plurality of memory cells viewed from a first direction and processing step 800-*c* may depict a plurality of memory cells viewed from a second direction. The second direction may be orthogonal to the first direction.

The material removed at processing steps 800-*b* and 800-*c* may be removed using a number of techniques, which may include, for example, chemical etching (also referred to as "wet etching"), plasma etching (also referred to as "dry etching"), or chemical-mechanical planarization. The etching may begin at first conductive material 805 or third conductive material 820. Additionally, the etching may result in chalcogenide material 815 having a first orientation or a second orientation. The second orientation may be opposite of the first orientation (e.g., flipped). After the removal of materials, dielectric material 830 may be deposited about the plurality of memory cells. Dielectric material may include at least one of: silicon nitride, silicon oxide, aluminum oxide, or afnium oxide. Finally, fourth conductive 825 material may be deposited above third conductive material 820. Fourth conductive material may be representative of a bit line (e.g., bit line 115-*a* of FIG. 2). One or more etching steps may be employed. Those skilled in the art will recognize that, in some examples, steps of a process described with a single exposure and/or etching step may be performed with separate etching steps and vice versa.

Figure 9:
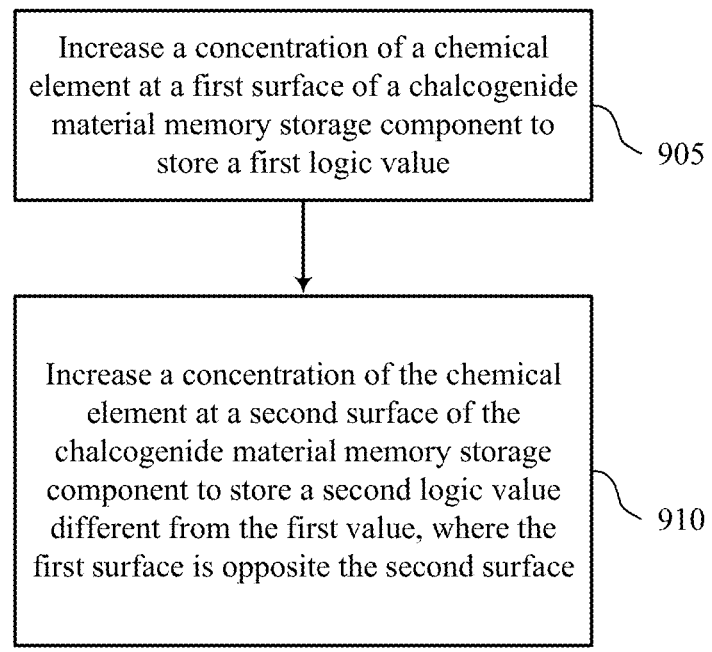
FIG. 9 is a flowchart that illustrates a method or methods for operating a self-selecting memory device that supports programming enhancement in accordance with examples of the present disclosure.

FIG. 9 shows a flowchart illustrating a method 900 for programming enhancement in self-selecting memory in accordance with embodiments of the present disclosure. The operations of method 900 may be implemented by a memory controller (e.g., memory controller 140-*a* with reference to FIG. 4) or its components as described herein. In some examples, a memory controller may execute a set of codes to control the functional elements of the device to perform the functions described below. Additionally or alternatively, the memory controller may perform aspects of the functions described below using special-purpose hardware.

At block 905 the memory controller may increase a local concentration of a chemical element at a first surface of a chalcogenide material memory storage component to store a first logic value. The operations of block 905 may be performed according to the methods described with reference to FIG. 1 through FIG. 5

At block 910 the memory controller may increase a concentration of the element at a second surface of the chalcogenide material memory storage component to store a second logic value different from the first value, wherein the first surface is opposite the second surface. The operations of block 910 may be performed according to the methods described with reference to FIG. 1 through FIG. 5.

In some cases, the second surface may have an area greater than an area of the first surface. Additionally, in some examples, the concentration of the chemical element at the first surface may be greater than the concentration of the chemical element at the second surface. In further cases, the method may also include applying a read pulse to the chalcogenide material memory storage component and determining whether the first logic value or the second logic value has been stored at the chalcogenide material memory storage component based at least in part on applying the read pulse. In some cases, the chemical element may be a cation and the pulse may be applied with a negative polarity. Further, the method may also include increasing a concentration of a different chemical element at the second surface of the memory storage component based at least in part on increasing the concentration of the chemical at the first surface. In various examples, the chemical element for which the concentration is increased may be selenium. Selenium ions, for example, may migrate from toward one or the other surfaces of the memory storage component (while other ions migrate in the opposite direction), thus affecting the threshold voltage for the memory storage element. Selenium may thus be a cation in some examples.

It should be noted that the methods described above describe possible implementations, and that the operations and the steps may be rearranged or otherwise modified and that other implementations are possible. Furthermore, features or steps from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a chalcogenide material memory storage element with a first surface and a second surface opposite the first surface, the second surface having a greater area than the first surface;
   a first electrode coupled with the first surface, the first electrode comprising a first rectangular surface having at least one side that forms a first right angle with the first surface; and
   a second electrode coupled with the second surface and in electronic communication with the first electrode via the chalcogenide material memory storage element, the second electrode comprising a second rectangular surface that is larger than the first rectangular surface, the second rectangular surface having at least one side that forms a second right angle with the second surface,
   wherein the chalcogenide material memory storage element comprises selenium, and wherein a concentration of the selenium relative to the first surface or the second surface is based at least in part on a polarity of a voltage across the chalcogenide material memory storage element between the first electrode and the second electrode, wherein a first concentration of the selenium corresponds to a first logic state and a second concentration of the selenium corresponds to a second logic state different from the first logic state.

2. The apparatus of claim 1, wherein the chalcogenide material memory storage element is configured so that the first concentration corresponds to a first threshold voltage of the chalcogenide material memory storage element and the second concentration corresponds to a second threshold voltage of the chalcogenide material memory storage element, a difference between the first threshold voltage and the second threshold voltage being based at least in part on an area of the first surface relative to an area of the second surface.

3. The apparatus of claim 2, wherein a logic state of the apparatus is based at least in part on programming the chalcogenide material memory storage element using the polarity of the voltage.

4. The apparatus of claim 1, wherein a cross-section of the chalcogenide material memory storage element comprises a trapezoid.

5. The apparatus of claim 1, wherein the chalcogenide material memory storage element comprises a trapezoidal prism.

6. The apparatus of claim 1, wherein the chalcogenide material memory storage element comprises a pyramidal frustum.

7. The apparatus of claim 1, wherein the first surface comprises a first side, the second surface comprises a second side opposite the first side, and the first surface of the chalcogenide material memory storage element and the second surface of the chalcogenide material memory storage element are connected by a third side, and wherein the first side of the first surface and the third side form an obtuse angle, and the second side of the second surface and the third side form an acute angle.

8. The apparatus of claim 1, wherein the first surface of the chalcogenide material memory storage element and the second surface of the chalcogenide material memory storage element are connected by a first face bounded by a first side, a second side, a third side, and a fourth side, and wherein the first surface comprises the first side, the second surface comprises the second side, and wherein the first side and the third side form an obtuse angle and the second side and the third side form an acute angle.

9. The apparatus of claim 1, wherein:
   the first electrode comprises a first side, a second side, a third side, and a fourth side, and wherein the first side of the first electrode and the second side of the first electrode form a substantially 90 degree angle and the first side of the first electrode and the third side of the first electrode from a substantially 90 degree angle, or
   the second electrode comprises a fifth side, a sixth side, a seventh side, and an eighth side, and wherein the fifth side of the second electrode and theسسsixth side of the second electrode form a substantially 90 degree angle and the fifth side of the second electrode and the seventh side of the second electrode form a substantially 90 degree angle, or both.

10. An apparatus, comprising:
- a chalcogenide material memory storage element with a first side, a second side opposite and larger than the first side, a third side adjacent to the first side and adjacent to the second side, and a fourth side opposite the third side, wherein the first side and the third side form an obtuse angle, and the second side and the third side form an acute angle;
- a first electrode coupled between the first side of the chalcogenide material memory storage element and a first access line, the first electrode comprising a first rectangular surface having at least one side that forms a first right angle with the first side; and
- a second electrode coupled between the second side of the chalcogenide material memory storage element and a second access line, the second electrode comprising a second rectangular surface that is larger than the first rectangular surface, the second rectangular surface having at least one side that forms a second right angle with the second side,
- wherein the chalcogenide material memory storage element comprises selenium, and wherein a concentration of the selenium relative to the first side or the second side is based at least in part on a polarity of a voltage across the chalcogenide material memory storage element between the first electrode and the second electrode, wherein a first concentration of the selenium corresponds to a first logic state and a second concentration of the selenium corresponds to a second logic state different from the first logic state.

11. The apparatus of claim 10, wherein the first side and the fourth side form a second obtuse angle and the second side and the fourth side form a second acute angle.

12. The apparatus of claim 11, wherein a portion of the first electrode in contact with the first side has less area than a portion of the second electrode in contact with the second side.

13. The apparatus of claim 10, wherein the chalcogenide material memory storage element comprises a self-selecting memory component.

14. The apparatus of claim 10, wherein the chalcogenide material memory storage element is configured so that the first concentration corresponds to a first threshold voltage of the chalcogenide material memory storage element and the second concentration corresponds to a second threshold voltage of the chalcogenide material memory storage element, a difference between the first threshold voltage and the second threshold voltage being based at least in part on a length of the first side relative to a length of the second side.

15. The apparatus of claim 10, wherein a logic state of the apparatus is based at least in part on a threshold voltage of the chalcogenide material memory storage element in contact with the first electrode.

16. An apparatus, comprising:
- a memory cell stack comprising a first electrode, a second electrode, and a chalcogenide material memory component that comprises:
  - a first face bounded by a first side, a second side, a third side, and a fourth side, wherein the first side and the third side form a first obtuse angle and the second side and the third side form a first acute angle; and
  - a second face adjacent to the first face and bounded by a fifth side, a sixth side, the third side, and a seventh side, wherein the fifth side and the third side form a second obtuse angle and the sixth side and the third side form a second acute angle;
- an electrode coupled with the first side and the fifth side and comprising a rectangular prism,
- wherein the chalcogenide material memory component comprises selenium, and wherein a concentration of the selenium relative to the first electrode or the second electrode is based at least in part on a polarity of a voltage across the chalcogenide material memory component between the first electrode and the second electrode, wherein a first concentration of the selenium corresponds to a first logic state and a second concentration of the selenium corresponds to a second logic state different from the first logic state.

17. The apparatus of claim 16, wherein:
- the first side of the first face is located above the second side of the first face; and
- the fifth side of the second face is located above the sixth side of the second face.

18. The apparatus of claim 16, wherein the chalcogenide material memory component is a pyramidal frustum.

19. The apparatus of claim 1, wherein the chalcogenide material memory storage element comprises a self-selecting memory component.

20. The apparatus of claim 16, wherein the chalcogenide material memory component comprises a self-selecting memory component.

* * * * *